US008947876B2

(12) United States Patent
Zhu et al.

(10) Patent No.: US 8,947,876 B2
(45) Date of Patent: Feb. 3, 2015

(54) RISER CARD MODULE AND ELECTRONIC DEVICE HAVING THE SAME

(75) Inventors: Chong-Xing Zhu, New Taipei (TW); Te-Hsiung Hsieh, New Taipei (TW); Yong-Liang Zheng, New Taipei (TW)

(73) Assignee: Wistron Corporation, New Taipei (TW)

( * ) Notice: Subject to any disclaimer, the term of this patent is extended or adjusted under 35 U.S.C. 154(b) by 350 days.

(21) Appl. No.: 13/556,336

(22) Filed: Jul. 24, 2012

(65) Prior Publication Data

US 2013/0027875 A1      Jan. 31, 2013

(30) Foreign Application Priority Data

Jul. 29, 2011   (CN) .......................... 2011 1 0215120

(51) Int. Cl.
*G06F 1/16*      (2006.01)
*H05K 7/14*      (2006.01)
*G06F 1/18*      (2006.01)

(52) U.S. Cl.
CPC .............. *H05K 7/1487* (2013.01); *G06F 1/185* (2013.01)
USPC ........................ 361/679.58; 361/724; 361/727

(58) Field of Classification Search
USPC .................................................... 361/679.58
See application file for complete search history.

(56) References Cited

U.S. PATENT DOCUMENTS

| 6,693,800 | B1 * | 2/2004 | Lin et al. ........................ 361/759 |
| 6,834,766 | B2 * | 12/2004 | Lin et al. ..................... 211/41.17 |
| 7,564,696 | B1 * | 7/2009 | Winick et al. ................. 361/801 |
| 2002/0075638 | A1 * | 6/2002 | Chen .............................. 361/683 |
| 2009/0073645 | A1 | 3/2009 | Tsai et al. |
| 2010/0002378 | A1 * | 1/2010 | Chen et al. ............... 361/679.58 |
| 2012/0049027 | A1 * | 3/2012 | Chen .......................... 248/309.1 |

FOREIGN PATENT DOCUMENTS

| CN | 2783399 Y | 5/2006 |
| CN | 201064048 Y | 5/2008 |
| JP | 2009-54396 A | 3/2009 |
| TW | I325526 | 4/1995 |
| TW | 532724 | 5/2003 |
| TW | I308474 | 4/2009 |

OTHER PUBLICATIONS

Chinese Office Action mailed Sep. 25, 2014 in Chinese Application No. 201110215120.X, with partial English translation (20 pages).
Taiwanese Office Action mailed Aug. 25, 2014 in Taiwanese Application No. 100127387 with partial English translation (11 pages).

* cited by examiner

*Primary Examiner* — Anthony Q Edwards
(74) *Attorney, Agent, or Firm* — Nixon & Vanderhye P.C.

(57) ABSTRACT

A riser card module includes a frame body, a carrier plate connected to the frame body for abutment against first surfaces of positioning plates of fixing brackets of expansion cards, a riser card disposed on the frame body and having a plurality of expansion slots for insertion therein of the expansion cards, respectively, and a limiting unit rotatable relative to the carrier plate about an axial direction which is perpendicular to a longitudinal direction of the carrier plate for abutment against second surfaces of the positioning plates of the fixing brackets of the expansion cards so as to restrict movement of the expansion cards relative to the riser card.

18 Claims, 6 Drawing Sheets

RISER CARD MODULE AND ELECTRONIC DEVICE HAVING THE SAME

CROSS-REFERENCE TO RELATED APPLICATION

This application claims priority of Chinese Patent Application No. 201110215120.X, filed on Jul. 29, 2011, the disclosure of which is incorporated herein by reference.

BACKGROUND OF THE INVENTION

1. Field of the Invention

The invention relates to a riser card module, and more particularly to a riser card module that is easy to assemble and that can save space and an electronic device having the same.

2. Description of the Related Art

Generally, because a server has a height restriction, an expansion card (for example, PCI, AGP or GPU card) is inserted into a riser card at a direction parallel to a motherboard, after which the riser card and the expansion card along with a support frame that supports the riser card are installed in a housing of the server. To overcome the time consuming and labor consuming disadvantages resulting from using the screw-fastening method to install the support frame, the riser card and the expansion card in the housing, a rotatable fixing element is used to fix the expansion card in the housing. The structure of the fixing element is similar to that of a movable element disclosed in Taiwanese Patent Number I325526.

However, when the support frame, the riser card and the expansion card are installed in the housing, since there is no other fixing structure that fixes the expansion card in the riser card, a user must hold onto the expansion card to align the same to an installing position, thereby causing inconvenience during assembly. Further, the current trend is to reduce the size of the servers, but taking for example the movable element disclosed in Taiwanese Patent Number I325526, because an axial direction of the movable element is parallel to a carrier plate, when the movable element is used to fix the expansion card, the housing must allocate a space having a width not smaller than an angular rotation of the movable element to permit passage of the movable element therethrough. This results in waste of space.

In view of this, how to develop a riser card module that is easy to assemble and that can save space has become an area of improvement of this invention.

SUMMARY OF THE INVENTION

Therefore, an object of this invention is to provide a riser card module that is easy to assemble and this can save space.

Another object of this invention is to provide an electronic device having a riser card module that is easy to assemble and that can save space.

According to one aspect of this invention, a riser card module is adapted for insertion of a plurality of expansion cards. Each of the expansion cards includes a circuit board and a fixing bracket. The fixing bracket includes an elongated body disposed on the circuit board, and a positioning plate protruding from one end of the elongated body. The positioning plate has a first surface and a second surface opposite to the first surface. The riser card module comprises a support frame, a riser card, and a limiting unit. The support frame includes a frame body, and a carrier plate connected to the frame body and adapted to abut against the first surfaces of the positioning plates of the fixing brackets of the expansion cards. The riser card is disposed on the frame body, and has a plurality of expansion slots for insertion therein of the expansion cards, respectively. The limiting unit is connected pivotably to the carrier plate. The limiting unit is rotatable relative to the carrier plate about an axial direction which is perpendicular to a longitudinal direction of the carrier plate, and is adapted to abut against the second surfaces of the positioning plates of the fixing brackets of the expansion cards so as to restrict movement of the expansion cards relative to the riser card.

The limiting unit includes a limiting body connected pivotably to the carrier plate, and a plurality of spring fingers formed on the limiting body for abutting against the second surfaces of the positioning plates of the fixing brackets of the expansion cards.

One of the limiting body and the carrier plate has a protrusion, and the other one of the limiting body and the carrier plate is formed with a through hole corresponding to the protrusion. The limiting unit is positioned on the carrier plate through engagement of the protrusion with the through hole.

The limiting body has a pivot portion connected pivotably to the carrier plate, a first limiting plate and a second limiting plate connected to the pivot portion and parallel to the carrier plate, and a connecting portion interconnecting the first and second limiting plates. The spring fingers are formed on the first limiting plate. The protrusion is formed on the second limiting plate. The first and second limiting plates and the connecting portion cooperatively define a receiving groove to receive the carrier plate and adapted to receive the positioning plates of the fixing brackets of the expansion cards.

The positioning plate of the fixing bracket of each expansion card is formed with a notch. The carrier plate is formed with a plurality of projections adapted to correspond to the notches of positioning plates of the fixing brackets of the expansion cards.

The fixing bracket of each expansion card further includes an insert part formed on one end of the elongated body that is distal from the positioning plate. The frame body is formed with a plurality of insert holes for insertion therein of the insert parts, respectively.

According to another aspect of this invention, an electronic device may be a server, and includes a housing, a substrate and the aforesaid riser card module. The housing defines a receiving chamber to receive removably therein the riser card module. The substrate is disposed in the housing within the receiving chamber, and has a riser socket to receive a riser card of the riser card module.

The housing has a first positioning element formed with a first guide groove to receive therein the limiting unit.

The support frame of the riser card module further has a positioning post formed on the frame body, and the housing has a second positioning element formed with a second guide groove to receive therein the positioning post. The positioning post has a guide slant surface on one end thereof that is distal from the frame body.

The housing has an engaging stud, and the frame body is formed with a retaining slot to receive engagingly the engaging stud.

The frame body has a first plate body connected perpendicularly to the carrier plate, and a second plate body connected to the first plate body and perpendicular to the carrier plate and the first plate body. The first plate body is exposed from the housing.

The efficiency of the present invention resides in that because the limiting unit can rotate relative to the carrier plate about the axial direction that is perpendicular to the longitudinal direction of the carrier plate and can abut against the positioning plates to restrict movement of the expansion cards relative to the riser card, the expansion cards can be inserted firmly into the riser card, thereby facilitating installation of the riser card module in the housing. Simultaneously, the size of the housing can be effectively reduced.

BRIEF DESCRIPTION OF THE DRAWINGS

Other features and advantages of the present invention will become apparent in the following detailed description of the embodiment with reference to the accompanying drawings, of which.

DETAILED DESCRIPTION OF THE PREFERRED EMBODIMENT

The above-mentioned and other technical contents, features, and effects of this invention will be clearly presented from the following detailed description of one embodiment in coordination with the reference drawings.

Figure 1:
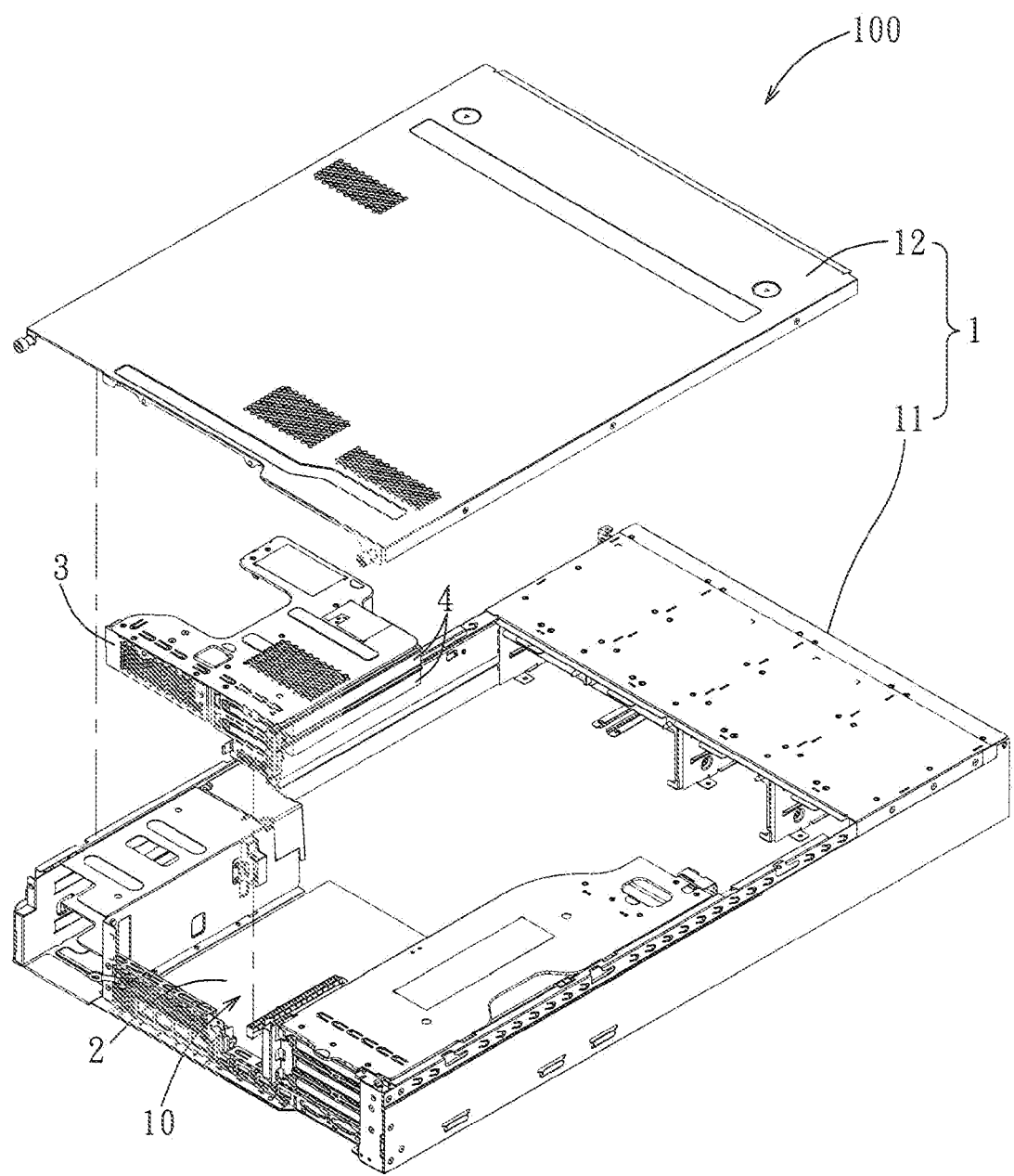
FIG. 1 is an exploded perspective view of an electronic device according to the embodiment of the present invention.
Figure 3:
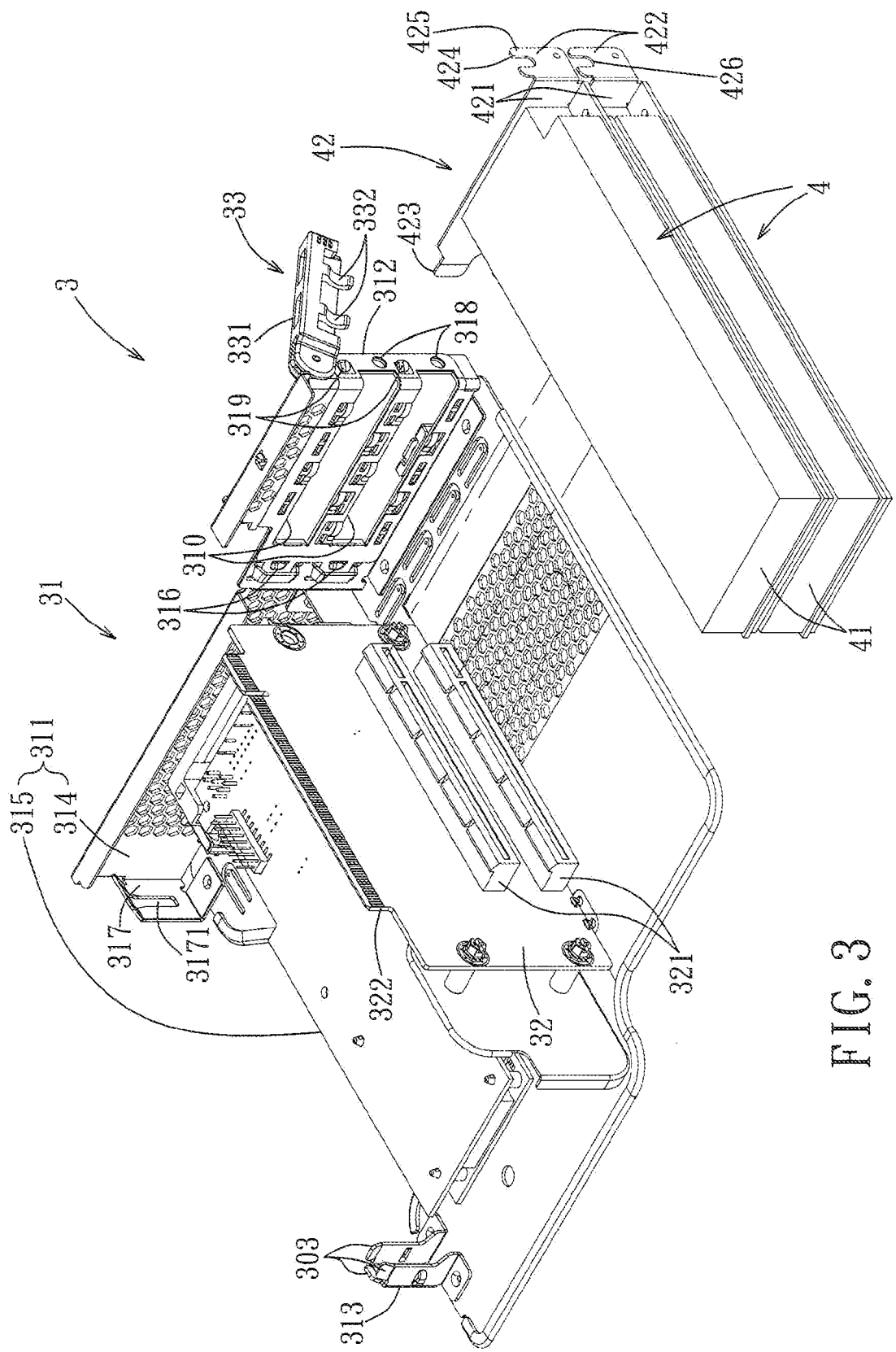
FIG. 3 is an enlarged bottom perspective view of a riser card module and two expansion cards of the embodiment.

Referring to FIGS. 1 and 3, an electronic device 100 according to the embodiment of the present invention is adapted for insertion of a plurality of expansion cards 4. Each of the expansion cards 4 includes a circuit board 41 and a fixing bracket 42. The fixing bracket 42 is L-shaped, and includes an elongated body 421 disposed on one end face of the circuit board 41, a positioning plate 422 protruding perpendicularly from one end of the elongated body 421, and an insert part 423 formed on another end of the elongated body 421 that is distal from the positioning plate 422. The positioning plate 422 is formed with a notch 426, and has a first surface 424 and a second surface 425 opposite to the first surface 424. The expansion cards 4 may be PCI, AGP, or GPU interface cards. The elongated body 421 may be formed with a slot (not shown) for exposure of a connection port (not shown) of the expansion card 4. The electronic device 100 may be a server or a personal computer which can be inserted with the expansion cards 4. In this embodiment, the electronic device 100 is a server. The electronic device 100 includes a housing 1, a substrate 2 and a riser card module 3.

Figure 2:
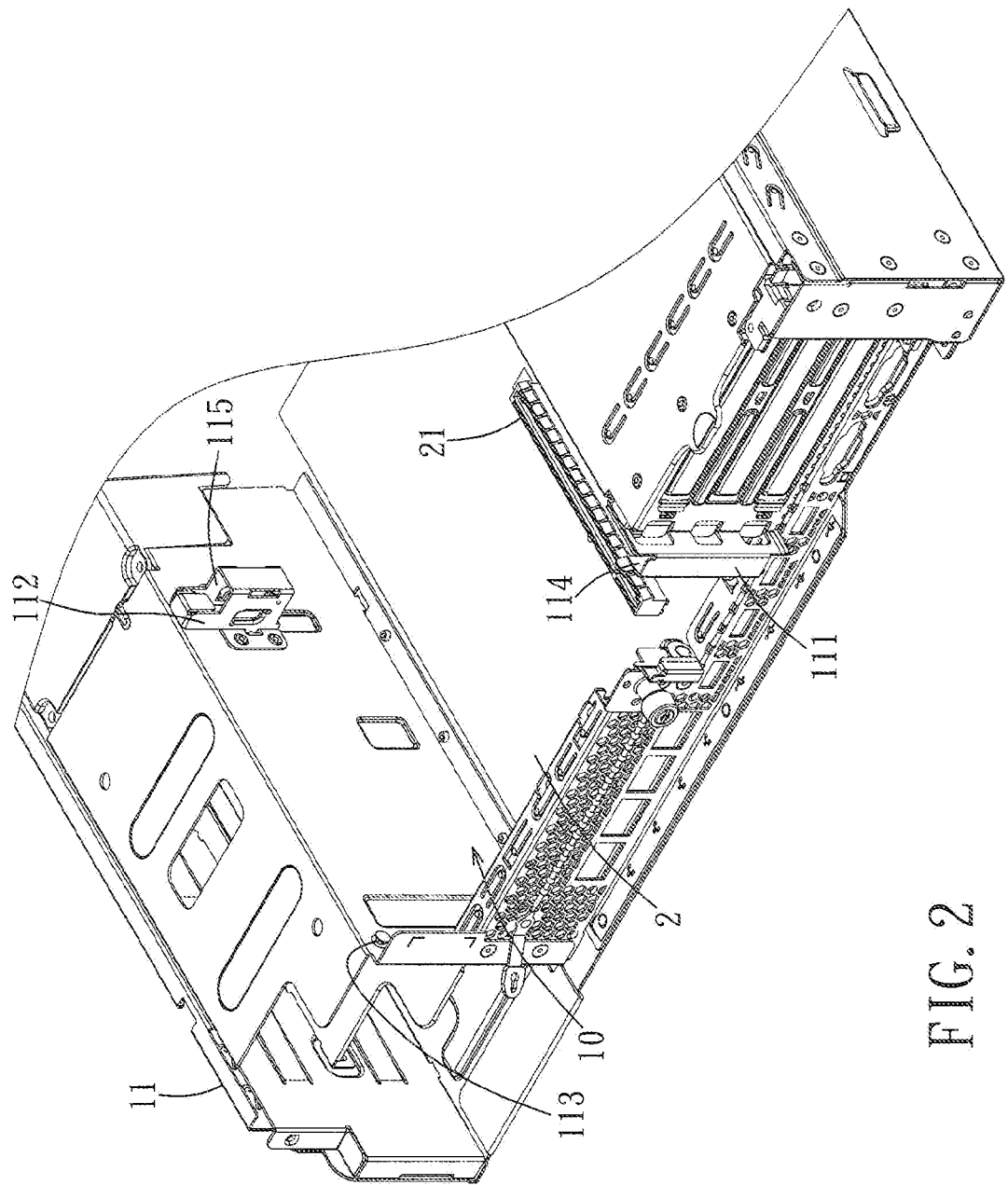
FIG. 2 is a fragmentary assembled perspective view of the embodiment.

With reference to FIGS. 1 and 2, the housing 1 defines a receiving chamber 10 for accommodating the substrate and the riser card module 3, and includes a main body 11 and a cover body 12 for covering the main body 11. The housing 1 further includes a first positioning element 111, a second positioning element 112 and an engaging stud 113 all disposed on the main body 11. The first positioning element 111 is formed with a first guide groove 114. The second positioning element 112 is formed with a second guide groove 115. The engaging stud 113 may be a screw that is fastened fixedly to the housing 11 and having a head.

The substrate 2 is disposed in the housing 1 within the receiving chamber 10 for mounting of discrete circuits and integrated circuits thereon, and has a riser socket 21.

Figure 4:
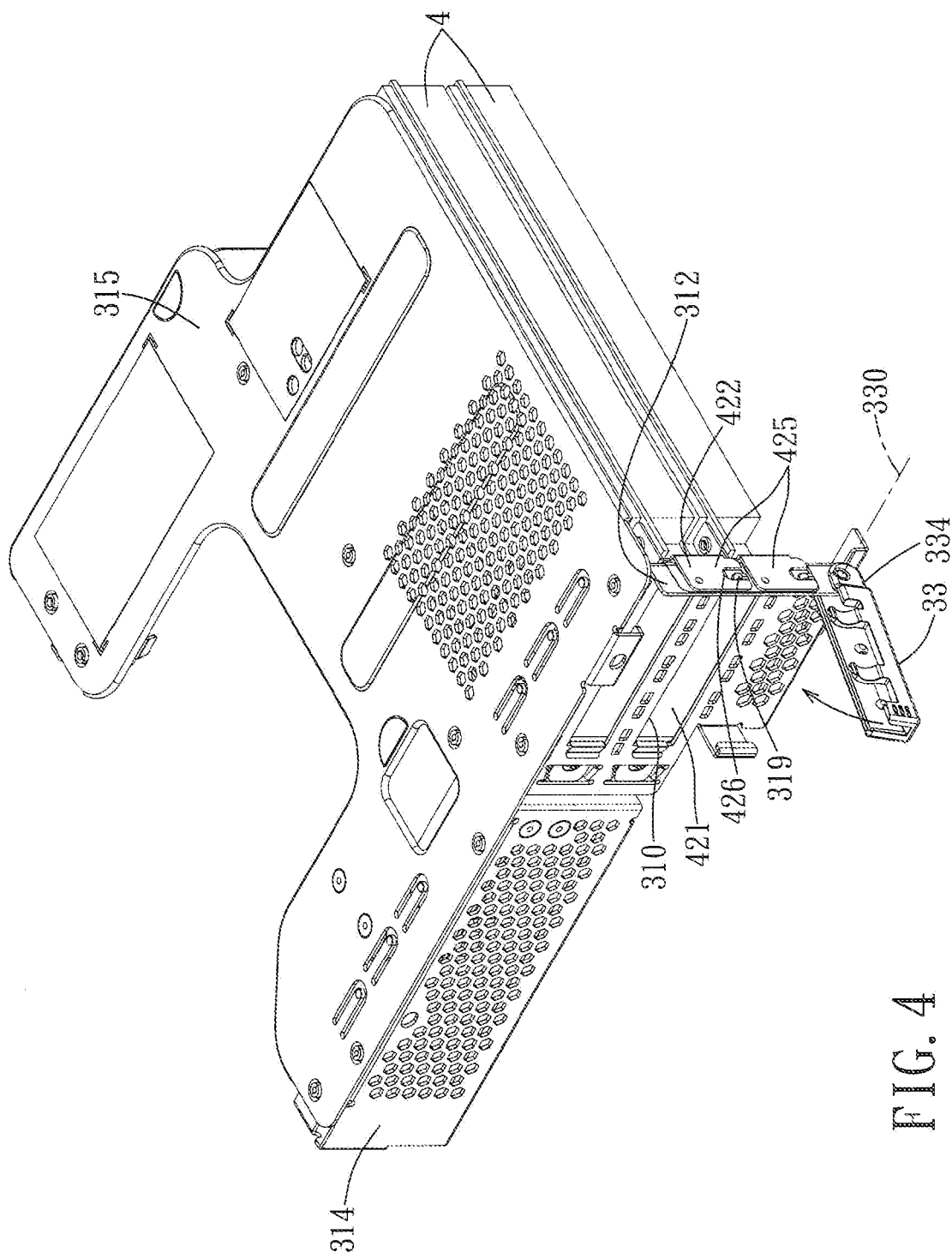
FIG. 4 is an enlarged top perspective view of the riser card module and the expansion cards in an assembled state.

With referring to FIGS. 2, 3 and 4, the riser card module 3 is disposed removably in the housing 11, and includes a support frame 31, a riser card 32, and a limiting unit 33. The support frame 31 includes a frame body 311, a carrier plate 312 connected to the frame body 311, and a positioning post 313 disposed on the frame body 311. The frame body 311 is generally L-shaped, and includes a first plate body 314, and a second plate body 315 connected perpendicularly to the first plate body 314. The first plate body 314 is formed with a plurality of openings 310 for exposure of the elongated bodies 421 of the fixing brackets 42 of the expansion cards 4, respectively, and a plurality of insert holes 316 formed at an inner side thereof that is proximate to the openings 310 and corresponding in position to the insert parts 423 of the fixing brackets 42 of the expansion cards 4. The carrier plate 312 is connected perpendicularly to one end of the first plate body 314 for abutment with the first surfaces 424 of the positioning plates 422 of the fixing brackets 42. The carrier plate 312 is formed with a plurality of spaced-apart through holes 318, and a plurality of projections 319 corresponding in position to the notches 426 of the positioning plates 422. Further, a retaining bracket 317 is connected to another end of the first plate body 314 that is distal from the carrier plate 312, and corresponds in position to the engaging stud 113. The retaining bracket 317 is formed with a retaining slot 3171. The positioning post 313 projects inwardly from a surface of the second plate body 315 to engage with the second guide groove 115 of the second positioning element 112. The positioning post 313 has a plurality of guide slant surfaces 303 distal from the surface of the second plate body 315 for easy alignment with the second guide groove 115 during assembly.

The riser card 32 is disposed on the second plate body 315 parallel to the carrier plate 312, and is inserted into the riser socket 21 of the substrate 3 through a plurality of terminal units 322. The riser card 32 has a plurality of expansion slots 321 for insertion therein of the respective expansion cards 4.

Figure 5:
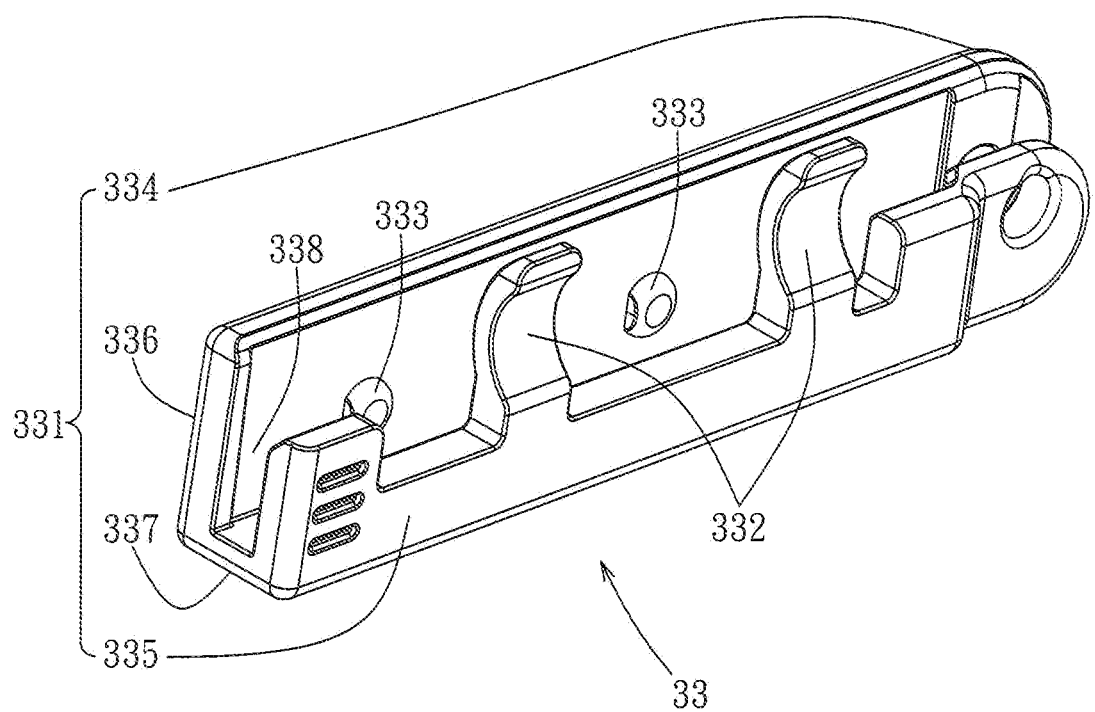
FIG. 5 is an enlarged perspective view of a limiting unit of the embodiment.
Figure 6:
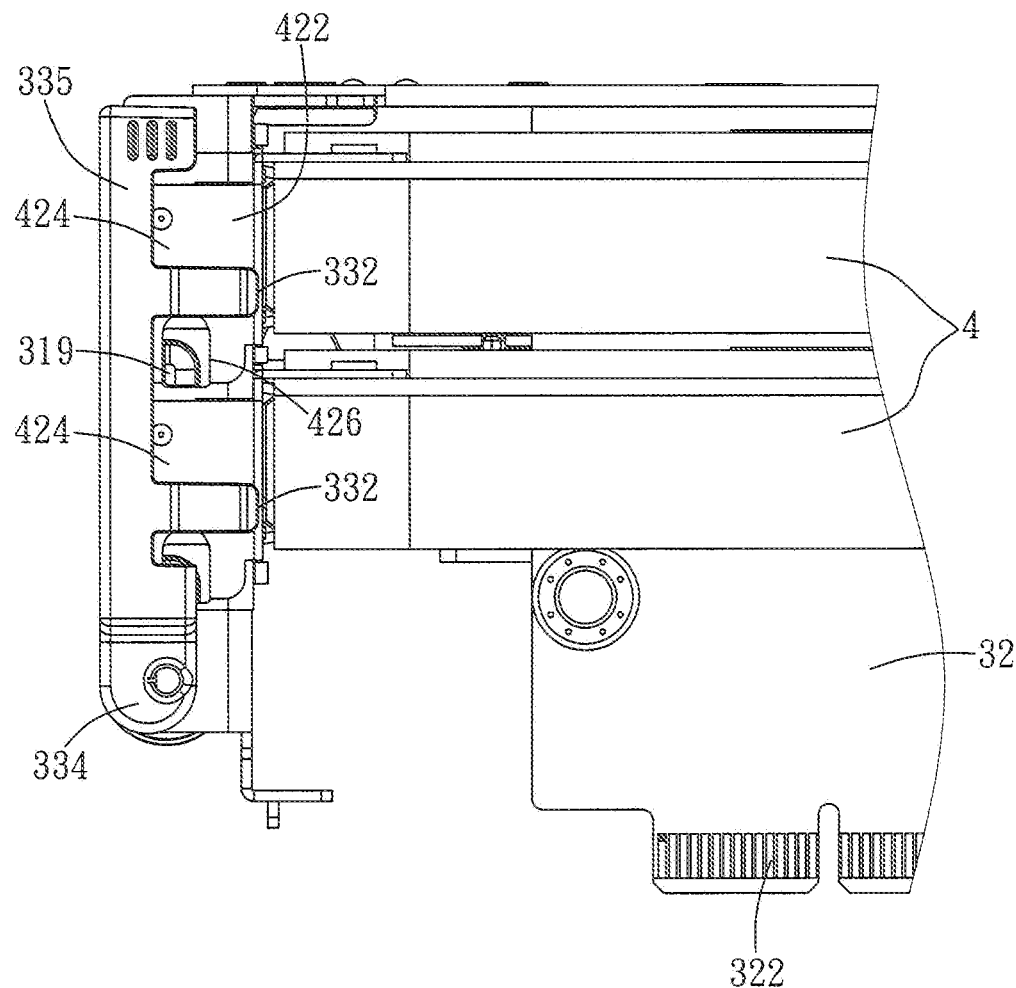
FIG. 6 is an enlarged fragmentary schematic side view of the riser card module and the expansion cards.

Referring to FIGS. 4 to 6, the limiting unit includes a limiting plate 331, and a plurality of spaced-apart spring fingers 322 and a plurality of spaced-apart protrusions 333 formed on the limiting plate 331. The limiting plate 331 has a pivot portion 334 connected pivotably to the carrier plate 312, a first limiting plate 335 and a second limiting plate 336 connected to the pivot portion 334 and parallel to the carrier plate 312, and a connecting portion 337 interconnecting the first and second limiting plates 335, 336. The limiting unit 33 rotates relative to the carrier plate 312 about an axial direction 330 (see FIG. 4) that is perpendicular to a longitudinal direction of the carrier plate 312 through the pivot portion 334. The first and second limiting plates 335, 336 and the connecting portion 337 cooperatively define a receiving groove 338 to receive the carrier plate 312 and the positioning plates 422. The spring fingers 322 extend from an edge of the first limiting plate 335 away from the connecting portion 337 for abutment against the respective second surfaces 425 of the positioning plates 422. The protrusions 333 protrudes from a surface of the second limiting plate 336 that faces the first limiting plate 335 for engagement with the respective through holes 318 in the carrier plate 312 so as to position the limiting unit 33 on the carrier plate 312.

During assembly, as shown in FIGS. 3 and 4, the notches 426 of the positioning plates 422 are first aligned with the projections 319 of the carrier plate 312, after which the expansion cards 4 are inserted into the respective expansion slots 321 in the riser card 32 until the first surfaces 424 of the positioning plates 422 abut against the carrier plate 312 and the insert parts 423 of the fixing brackets 42 are inserted into the respective insert holes 316 in the first plate body 314. Next, the limiting unit 33 is pivoted in the direction of an arrow shown in FIG. 4 to a position shown in FIG. 6 so that the protrusions 333 of the limiting unit 33 engage with the respective through holes 318 in the carrier plate 312 and the spring fingers 322 of the limiting unit 33 abut against the second surfaces 425 of the positioning plates 422, thereby restricting movement of the expansion cards 4 relative to the riser card 32. At this time, the expansion cards 4 are positioned firmly to the riser card 32 through cooperation of the support frame 31 and the limiting unit 33. Afterwards, with reference to FIGS. 1 to 3, to install the riser card module 3 along with the expansion cards 4 in the housing 1, the limiting unit 33 is inserted into the first guide groove 114 of the first positioning element 111, the positioning post 313 of the support frame 31 is inserted into the second guide groove 115 of the second positioning element 112, and the retaining slot 3171 in the retaining bracket 317 of the support frame 31 receives engagingly the engaging stud 113 of the main body 11. Further, the terminal units 322 of the riser card 32 are inserted into the riser socket 21 of the substrate 2. Finally, the main body 11 is covered by the cover body 12 such that the first plate body 314 and the openings 310 are exposed from the housing 1, thereby completing the assembly.

In sum, the efficiency of the electronic device 100 of this invention resides in that because the limiting unit 33 can rotate relative to the carrier plate 312 about the axial direction 330 that is perpendicular to the longitudinal direction of the carrier plate 312, and because the spring fingers 322 can abut against the positioning plates 422 to restrict movement of the expansion cards 4 relative to the riser card 32, the expansion cards 4 can be inserted firmly into the riser card 32, thereby facilitating installation of the riser card module 3 in the housing 1. Simultaneously, the size of the housing 1 can be effectively reduced. Therefore, the objects of this invention can be realized.

While the present invention has been described in connection with what is considered the most practical embodiment, it is understood that this invention is not limited to the disclosed embodiment but is intended to cover various arrangements included within the spirit and scope of the broadest interpretation so as to encompass all such modifications and equivalent arrangements.

What is claimed is:

1. A riser card module for insertion of a plurality of expansion cards, each of the expansion cards including a circuit board and a fixing bracket, the fixing bracket including an elongated body disposed on the circuit board, and a positioning plate protruding from one end of the elongated body, the positioning plate having a first surface and a second surface opposite to the first surface, said riser card module comprising:
 a support frame including a frame body, and a carrier plate connected to said frame body and adapted to abut against the first surfaces of the positioning plates of the fixing brackets of the expansion cards;
 a riser card disposed on said frame body and having a plurality of expansion slots for insertion therein of the expansion cards, respectively; and
 a limiting unit connected pivotably to said carrier plate, said limiting unit being rotatable relative to said carrier plate about an axial direction which is perpendicular to a longitudinal direction of said carrier plate, and being adapted to abut against the second surfaces of the positioning plates of the fixing brackets of the expansion cards so as to restrict movement of the expansion cards relative to said riser card.

2. The riser card module as claimed in claim 1, wherein said limiting unit includes a limiting body connected pivotably to said carrier plate, and a plurality of spring fingers formed on said limiting body for abutting against the second surfaces of the positioning plates of the fixing brackets of the expansion cards.

3. The riser card module as claimed in claim 2, wherein one of said limiting body and said carrier plate has a protrusion, and the other one of said limiting body and said carrier plate is formed with a through hole corresponding to said protrusion, said limiting unit being positioned on said carrier plate through engagement of said protrusion with said through hole.

4. The riser card module as claimed in claim 3, wherein said limiting body has a pivot portion connected pivotably to said carrier plate, a first limiting plate and a second limiting plate connected to said pivot portion and parallel to said carrier plate, and a connecting portion interconnecting said first and second limiting plates, said spring fingers being formed on said first limiting plate, said protrusion being formed on said second limiting plate, said first and second limiting plates and said connecting portion cooperatively defining a receiving groove to receive said carrier plate and adapted to receive the positioning plates of the fixing brackets of the expansion cards.

5. The riser card module as claimed in claim 1, the positioning plate of the fixing bracket of each expansion card is formed with a notch, wherein said carrier plate is formed with a plurality of projections adapted to correspond to the notches of positioning plates of the fixing brackets of the expansion cards.

6. The riser card module as claimed in claim 1, the fixing bracket of each expansion card further includes an insert part formed on one end of said elongated body that is distal from the positioning plate, wherein said frame body is formed with a plurality of insert holes for insertion therein of the insert parts, respectively.

7. An electronic device for insertion of a plurality of expansion cards, each of the expansion cards having a circuit board and a fixing bracket, the fixing bracket including an elongated body disposed on the circuit board, and a positioning plate protruding from one end of the elongated body, the positioning plate having a first surface and a second surface opposite to the first surface, said electronic device comprising:
 a housing defining a receiving chamber;
 a substrate disposed in said housing within said receiving chamber and having a riser socket; and
 a riser card module disposed removably in said housing and including
  a support frame including a frame body, and a carrier plate connected to said frame body and adapted to abut against the first surfaces of the positioning plates of the fixing brackets of the expansion cards;
  a riser card disposed on said frame body and having a plurality of expansion slots for insertion therein of the expansion cards, respectively; and
  a limiting unit connected pivotably to said carrier plate, said limiting unit being rotatable relative to said carrier plate about an axial direction which is perpendicular to a longitudinal direction of said carrier plate, and being adapted to abut against the second surfaces of the positioning plates of the fixing brackets of the expansion cards so as to restrict movement of the expansion cards relative to said riser card.

8. The electronic device as claimed in claim 7, wherein said limiting unit includes a limiting body connected pivotably to said carrier plate, and a plurality of spring fingers formed on said limiting body for abutting against the second surfaces of the positioning plates of the fixing brackets of the expansion cards.

9. The electronic device as claimed in claim 8, wherein one of said limiting body and said carrier plate has a protrusion, and the other one of said limiting body and said carrier plate is formed with a through hole corresponding to said protrusion, said limiting unit being positioned on said carrier plate through engagement of said protrusion with said through hole.

10. The electronic device as claimed in claim 9, wherein said limiting body has a pivot portion connected pivotably to said carrier plate, a first limiting plate and a second limiting plate connected to said pivot portion and parallel to said carrier plate, and a connecting portion interconnecting said first and second limiting plates, said spring fingers being formed on said first limiting plate, said protrusions being formed on said second limiting plate, said first and second limiting plates and said connecting portion cooperatively defining a receiving groove to receive said carrier plate and adapted to receive the positioning plates of the fixing brackets of the expansion cards.

11. The electronic device as claimed in claim 7, the positioning plate of the fixing bracket of each expansion card is formed with a notch, wherein said carrier plate is formed with a plurality of projections adapted to correspond to the notches of positioning plates of the fixing brackets of the expansion cards.

12. The electronic device as claimed in claim 7, the fixing bracket of each expansion card further includes an insert part formed on one end of said elongated body that is distal from the positioning plate, wherein said frame body is formed with a plurality of insert holes for insertion therein of the insert parts, respectively.

13. The electronic device as claimed in claim 7, wherein said housing has a first positioning element formed with a first guide groove to receive therein said limiting unit.

14. The electronic device as claimed in claim 7, wherein said support frame of said riser card module further has a positioning post formed on said frame body, and said housing has a second positioning element formed with a second guide groove to receive therein said positioning post.

15. The electronic device as claimed in claim 14, wherein said positioning post has a guide slant surface on one end thereof that is distal from said frame body.

16. The electronic device as claimed in claim 7, wherein said housing has an engaging stud, and said frame body is formed with a retaining slot to receive engagingly said engaging stud.

17. The electronic device as claimed in claim 7, wherein said frame body has a first plate body connected perpendicularly to said carrier plate, and a second plate body connected to said first plate body and perpendicular to said carrier plate and said first plate body, said first plate body being exposed from said housing.

18. The electronic device as claimed in claim 7, wherein said electronic device is a server.

* * * * *